United States Patent
Chou et al.

(10) Patent No.: US 9,653,459 B2
(45) Date of Patent: May 16, 2017

(54) MOSFET HAVING SOURCE REGION FORMED IN A DOUBLE WELLS REGION

(75) Inventors: Hsueh-Liang Chou, Jhubei (TW); Chun-Wai Ng, Hsin-Chu (TW); Po-Chih Su, New Taipei (TW); Ruey-Hsin Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 153 days.

(21) Appl. No.: 13/541,539

(22) Filed: Jul. 3, 2012

(65) Prior Publication Data
US 2014/0008724 A1  Jan. 9, 2014

(51) Int. Cl.
| | | |
|---|---|---|
| *H01L 27/088* | (2006.01) | |
| *H01L 29/78* | (2006.01) | |
| *H01L 29/66* | (2006.01) | |
| *H01L 29/08* | (2006.01) | |
| *H01L 27/092* | (2006.01) | |
| *H01L 29/06* | (2006.01) | |
| *H01L 21/761* | (2006.01) | |

(52) U.S. Cl.
CPC .......... *H01L 27/088* (2013.01); *H01L 21/761* (2013.01); *H01L 27/092* (2013.01); *H01L 29/0638* (2013.01); *H01L 29/0852* (2013.01); *H01L 29/66659* (2013.01); *H01L 29/7833* (2013.01); *H01L 29/7835* (2013.01)

(58) Field of Classification Search
CPC ..... H01L 27/088; H01L 27/092; H01L 29/06; H01L 29/66681; H01L 29/783; H01L 29/7833; H01L 27/0927; H01L 29/0852; H01L 29/1095; H01L 29/66659; H01L 29/7835
USPC ....................................... 257/336
See application file for complete search history.

(56) References Cited

U.S. PATENT DOCUMENTS

| | | | | |
|---|---|---|---|---|
| 5,371,394 A | * | 12/1994 | Ma et al. ....................... | 257/335 |
| 6,117,738 A | * | 9/2000 | Tung ............................... | 438/286 |
| 6,392,274 B1 | * | 5/2002 | Tung .................... | H01L 29/0623 257/335 |
| 7,838,937 B1 | * | 11/2010 | Walker et al. ................. | 257/355 |
| 2007/0278568 A1 | * | 12/2007 | Williams .............. | H01L 21/761 257/335 |
| 2008/0017948 A1 | * | 1/2008 | Huang et al. ................. | 257/487 |
| 2009/0032868 A1 | * | 2/2009 | Chen et al. .................... | 257/336 |
| 2009/0085101 A1 | * | 4/2009 | Huang .................. | H01L 29/063 257/328 |
| 2011/0079846 A1 | * | 4/2011 | Yao et al. ...................... | 257/335 |

FOREIGN PATENT DOCUMENTS

CN  102222620 A  10/2011

\* cited by examiner

*Primary Examiner* — Anh Mai
(74) *Attorney, Agent, or Firm* — Slater Matsil, LLP

(57) ABSTRACT

A MOS transistor comprises a substrate of a first conductivity, a first region of the first conductivity formed over the substrate, a second region of the first conductivity formed in the first region, a first drain/source region of a second conductivity formed in the second region, a second drain/source region of the second conductivity and a body contact region of the first conductivity, wherein the body contact region and the first drain/source region are formed in an alternating manner from a top view.

18 Claims, 10 Drawing Sheets

MOSFET HAVING SOURCE REGION FORMED IN A DOUBLE WELLS REGION

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrink the process node towards the sub-20 nm node). As semiconductor devices are scaled down, new techniques are needed to maintain the electronic components' performance from one generation to the next. For example, low gate-to-drain capacitance and high breakdown voltage of transistors may be desirable for power applications.

As semiconductor technologies evolve, metal oxide semiconductor field effect transistors (MOSFET) have been widely used in today's integrated circuits. MOSFETs are voltage controlled devices. When a control voltage is applied to the gate a MOSFET and the control voltage is greater than the threshold of the MOSFET, a conductive channel is built between the drain and the source of the MOSFET. As a result, a current flows between the drain and the source of the MOSFET. On the other hand, when the control voltage is less than the threshold of the MOSFET, the MOSFET is turned off accordingly.

MOSFETs may include two major categories. One is n-channel MOSFETs; the other is p-channel MOSFETs. According to the structure difference, MOSFETs can be further divided into two sub-categories, namely trench power MOSFETs and lateral power MOSFETs.

As process nodes keep shrinking, the physical size of MOSFETs is scaled down. The scaled down structure of MOSFETs may lead to the change of the electrical characteristics of MOSFETs due to short channel effects. For example, in order to obtain a low on resistance MOSFET, a shorter channel length is employed to reduce the on resistance. However, such a shorter channel length may cause the short channel effect. More particularly, as the drain region and the source region of the MOSFET get closer, the risk of punch-through failures may increase as a result.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, a lateral metal oxide semiconductor (MOS) device with superimposed wells. The embodiments of the disclosure may also be applied, however, to a variety of semiconductor devices.

Figure 1:
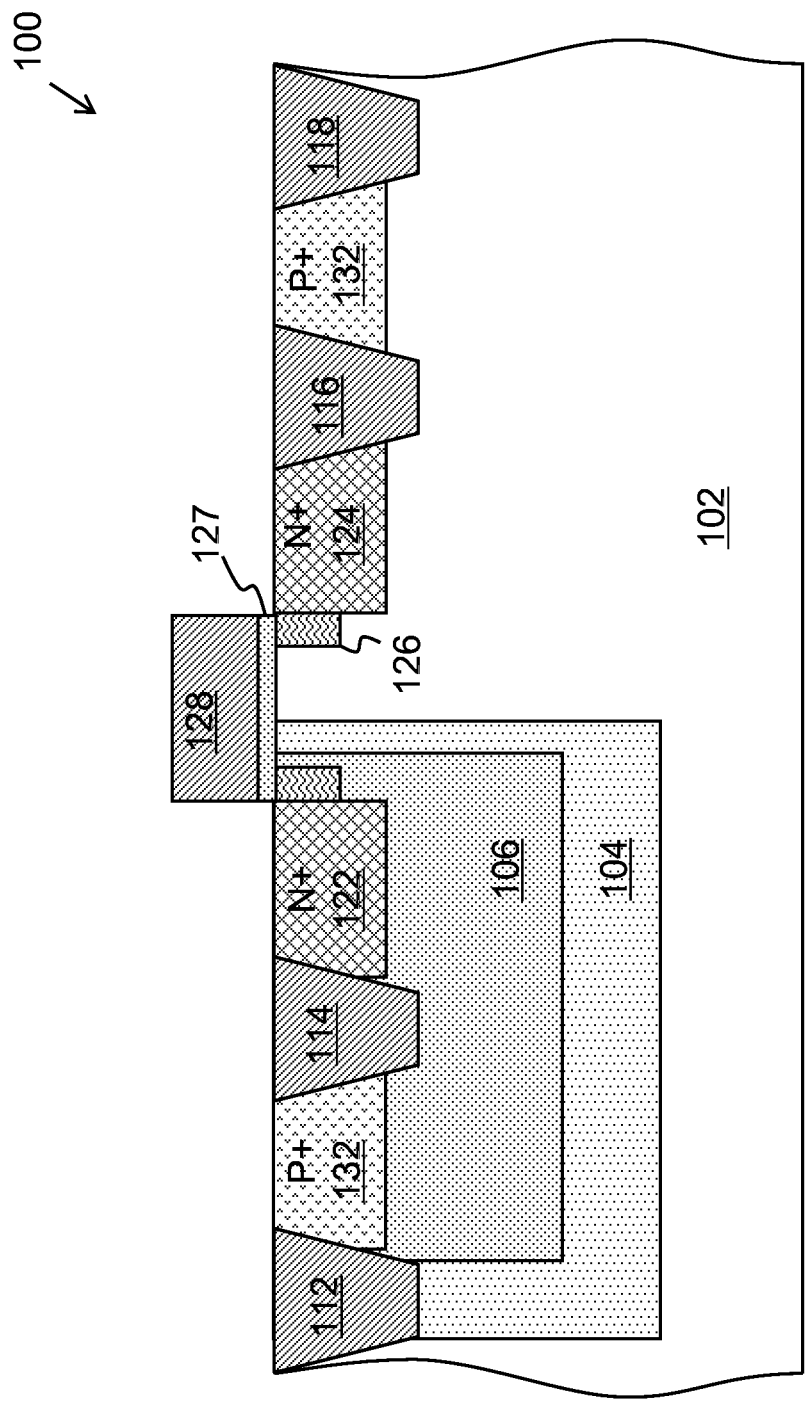
FIG. 1 illustrates a simplified cross-sectional view of a MOS transistor with superimposed wells in accordance with an embodiment.

FIG. 1 illustrates a simplified cross-sectional view of a MOS transistor with superimposed wells in accordance with an embodiment. The MOS transistor 100 includes a substrate 102, preferably P-type, a first P-type region 104 and a second P-type region 106 formed in the substrate 102. More particularly, the second P-type region 106 is embedded in the first P-type region 104.

A P+ region 132 and a first N+ region 122 are formed in the second P-type region 106. A second N+ region 124 and a second P+ region 132 are formed in the substrate 102. As shown in FIG. 1, the first N+ region 122 and the second N+ region 124 are formed on opposite sides of a gate electrode 128.

In order to improve the performance of the MOS transistor 100, two lightly doped drain/source (LDD) regions 126 are formed adjacent to their respective N+ regions (first N+ region 122 and second N+ region 124). In accordance with an embodiment, the first N+ region 122 functions as a source region of the MOS transistor 100; the second N+ region 124 functions a drain region the MOS transistor 100. The LDD regions 126 function as extensions of their corresponding drain region 124 and source region 122. The MOS transistor 100 further comprises a gate dielectric layer 127 and the gate electrode 128 formed over the gate dielectric 127.

The substrate 102 may be formed of silicon, silicon germanium, silicon carbide or the like. Alternatively, the substrate 102 may be a silicon-on-insulator (SOI) substrate. The SOI substrate may comprise a layer of a semiconductor material (e.g., silicon, germanium and the like) formed over an insulator layer (e.g., buried oxide and the like), which is formed in a silicon substrate. Other substrates that may be used include multi-layered substrates, gradient substrates, hybrid orientation substrates and the like.

The first P-type region 104 and second P-type region 106 may be formed by implanting p-type doping materials such as boron, gallium, aluminum, indium, combinations thereof, or the like. Alternatively, the P-type region 106 can be formed by a diffusion process. In accordance with an embodiment, a 5V complementary metal oxide semiconductor (CMOS) process is employed to form the first P-type well 104. A 1.8V CMOS process is employed to form the second P-type well 106.

As the second P-type well 106 is embedded in the first P-type well 104, the combined doping density is higher than the conventional P-well formed by a single 5V CMOS process. The combined doping density of the P-wells is in range from about $10^{17}/cm^3$ to about $10^{18}/cm^3$. It should be noted that the formation processes of the first P-type region 104 and the second P-type region 106 are compatible with the existing fabrication process of MOS transistors. In other words, the superimposed wells shown in FIG. 1 may be formed without introducing extra fabrication steps.

The first N+ region 122 is formed over the second P-type well 106. In accordance with an embodiment, the first N+ region 122 functions as the source of the MOS transistor 100. The source region may be formed by implanting an n-type dopant such as phosphorous at a concentration of between about $10^{19}/cm^3$ and about $10^{20}/cm^3$. Furthermore, a source contact (not shown) may be formed over the first N+ region 122.

The second N+ region 124 is formed in the substrate 102. In accordance with an embodiment, the second N+ region 124 may be the drain of the MOS transistor 100. The drain region may be formed by implanting an n-type dopant such as phosphorous at a concentration of between about $10^{19}/cm^3$ and about $10^{20}/cm^3$. As shown in FIG. 1, the drain region is formed on the opposite side from the source (the first N+ region 122).

The P+ region 132 shown in FIG. 1 may be part of a P+ pickup ring. The P+ pickup ring may surround the drain and source regions of the MOS transistor 100. As such, there may be two P+ regions 132 shown in FIG. 1 from the cross section view of the MOS transistor 100. A first P+ region 132 is formed adjacent to the first N+ region 122 and separated from the first N+ region 122 by an isolation region 114. The second P+ region 132 is formed adjacent to the second N+ region 124 and separated from the second N+ region 124 by another isolation region 116.

The P+ region 132 may be formed by implanting a p-type dopant such as boron at a concentration of between about $10^{19}/cm^3$ and about $10^{20}/cm^3$. The P+ region 132 may be coupled to the p-type body (the substrate 102) of the MOS transistor 100 through the second P-type well 106 and the first P-type well 104. In order to eliminate the body effect, the P+ region 132 may be coupled to the source 122 directly through the source contact (not shown).

The gate dielectric layer 127 is formed between the first N+ region 122 and the second N+ region 124. The gate dielectric layer 127 may be formed of silicon oxide, silicon oxynitride, hafnium oxide, zirconium oxide or the like. In accordance with an embodiment, the gate dielectric layer 127 is of a thickness of between about 100 Å and about 200 Å. A gate electrode 128 is formed on the gate dielectric layer 127. The gate electrode 128 may be formed of polysilicon, polysilicon germanium, nickel silicide or other metal, metal alloy materials and the like.

As shown in FIG. 1, there may be four isolation regions, namely a first isolation 112, a second isolation region 114, a third isolation region 116 and a fourth isolation region 118. The isolation regions are used to isolate active regions so as to prevent leakage current from flowing between adjacent active regions. The isolation region (e.g., the first isolation region 112) can be formed by various ways (e.g., thermally grown, deposited) and materials (e.g., silicon oxide, silicon nitride). In this embodiment, the isolation regions may be fabricated by a shallow trench isolation (STI) technique.

Figure 2:
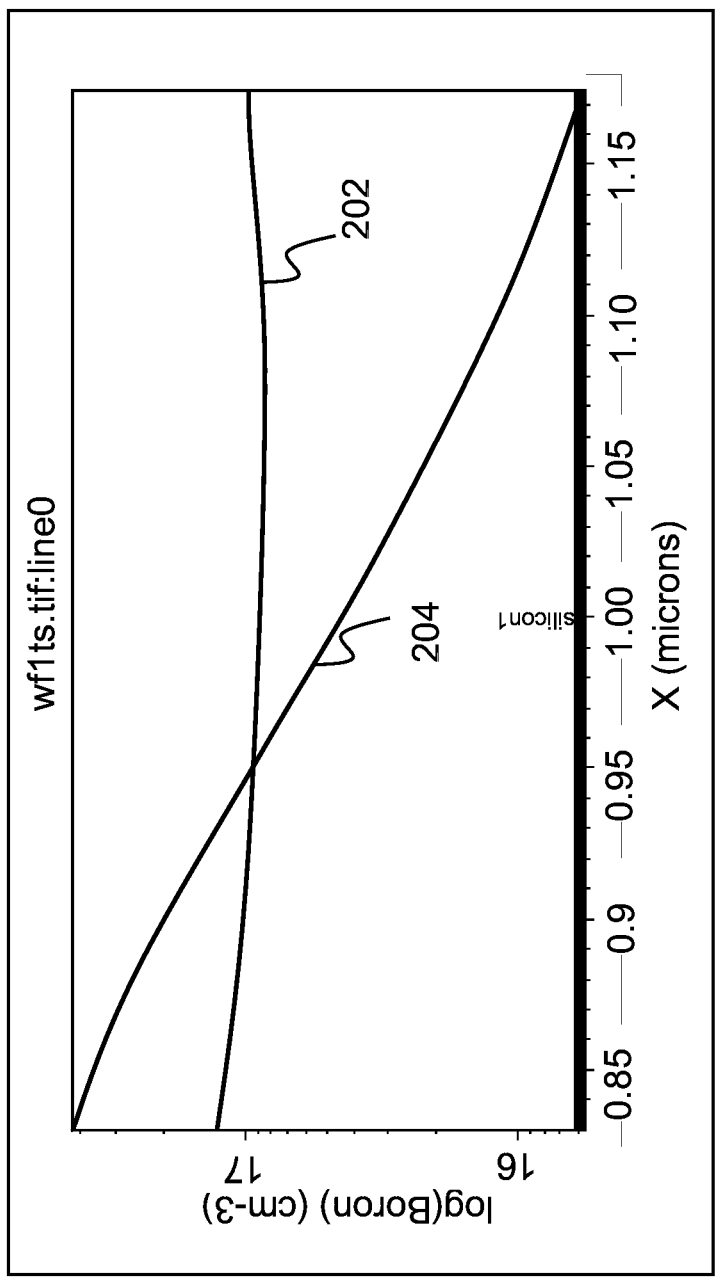
FIG. 2 illustrates two curves illustrating the doping density difference between a traditional MOS transistor with a 5V p-well and the MOS transistor with two superimposed p-wells.
Figure 3:
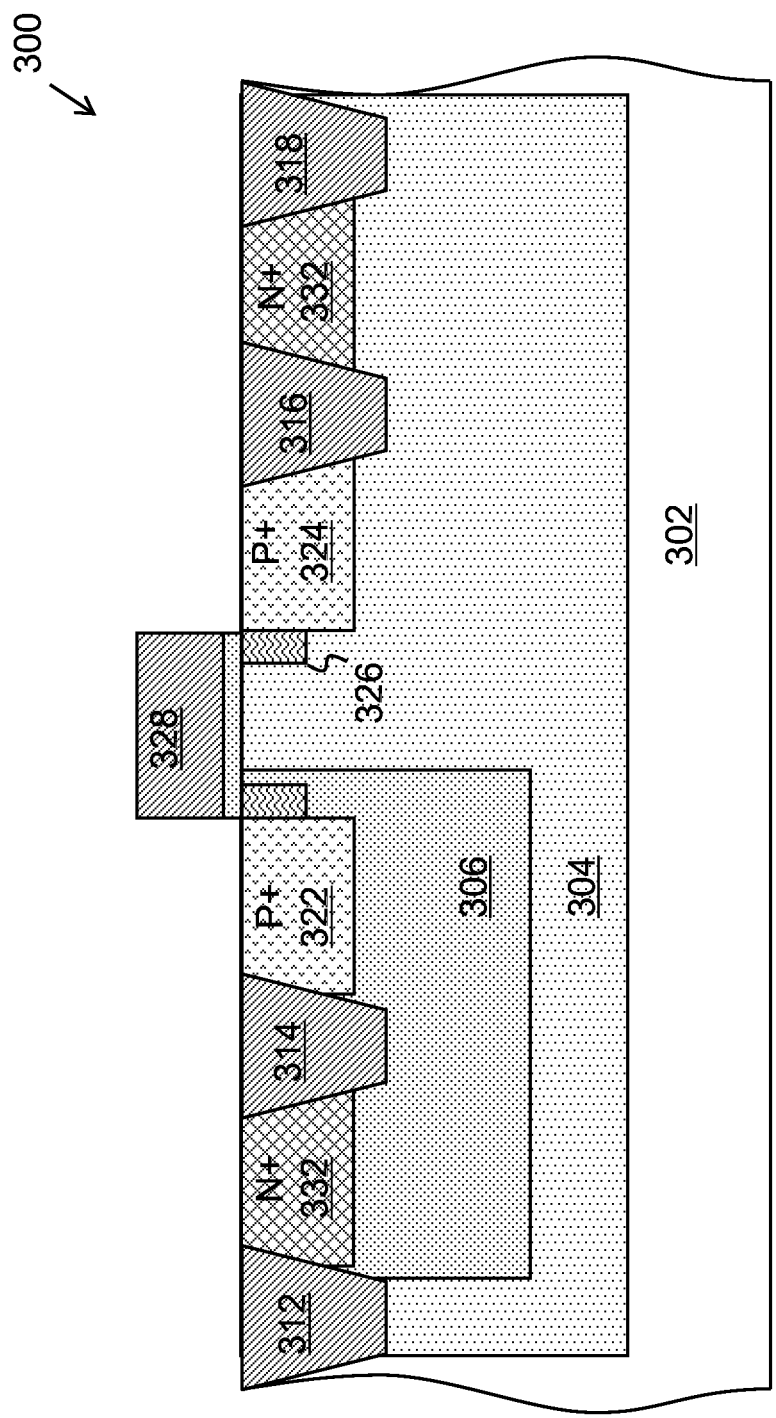
FIG. 3 illustrates a simplified cross-sectional view of a MOS transistor with superimposed wells in accordance with another embodiment.

FIG. 2 illustrates two curves illustrating the doping density difference between a traditional MOS transistor with a 5V p-well and the MOS transistor with two superimposed p-wells shown in FIG. 1. The horizontal axis of FIG. 2 represents the distance from the source region (first N+ region 122) to the drain region (second N+ region 124) of the MOS transistor 100 shown in FIG. 1. In other words, the starting point of the horizontal axis represents the p-well region adjacent to the source (the first N+ region 122 shown in FIG. 1). The end point of the horizontal axis represents the substrate region adjacent to the drain (the second N+ region 124 shown in FIG. 1). The vertical axis of FIG. 3 represents the doping density.

A curve 202 and a curve 204 illustrate the doping density difference between a traditional MOS transistor with a 5V p-well and the MOS transistor with superimposed p-wells. As shown in FIG. 2, in the region having two superimposed p-wells, the doping density of the MOS transistor 100 shown in FIG. 1 is higher than that of the traditional MOS transistor. On the other hand, in the region without a 5V p-well such as the substrate regions adjacent to the drain of the MOS transistor 100, the doping density of the MOS transistor 100 shown in FIG. 1 is lower than that of the traditional MOS transistor because there may be a 5V p-well formed under the drain of the traditional MOS transistor.

In accordance with an embodiment, the traditional MOS transistor's doping density shown in FIG. 2 is approximately consistent. The doping density is in a range from about $8 \times 10^{16}/cm^3$ and about $6 \times 10^{17}/cm^3$. In contrast, the doping density of the MOS transistor 100 shown in FIG. 1 is a slope, which has a higher doping density in the regions adjacent to the source and a lower doping density in the regions adjacent to the drain. In accordance with an embodiment, the doping density of the MOS transistor shown in FIG. 1 is in a range from about $8 \times 10^{15}/cm^3$ and about $8 \times 10^{17}/cm^3$. It should be noted that the second P-type well 106 is of a higher doping concentration in comparison with the first P-type well 104 because the second P-type well 106 is formed by a 1.8V CMOS process and the first P-type well 104 is formed by a 5V CMOS process.

FIG. 2 shows the MOS transistor having superimposed p-wells may achieve a higher doping density in the region adjacent to the source. Such a higher doping density helps to improve the punch-through window of the MOS transistor 100. As such, a shorter channel length may be employed to further reduce the pitch as well as the on resistance of the MOS transistor 100.

In addition, FIG. 2 illustrates that the doping density of the body region from the P-type wells to the second N+ region 124 of the MOS transistor 100 is lower than that of the traditional MOS transistor. The lower doping density in the body region helps to reduce the body resistance of MOS transistor 100. The reduced body resistance helps to prevent the parasitic body transistor from being falsely turned on. As a result, the reliability of the MOS transistor 100 such as safe operating area (SOA) may be improved.

FIG. 3 illustrates a simplified cross-sectional view of a MOS transistor with superimposed wells in accordance with another embodiment. The cross sectional view of FIG. 3 is similar to the cross sectional view of FIG. 1 expect that the MOS transistor 300 shown in FIG. 3 is a p-type MOS transistor rather than an n-type MOS transistor 100 shown in FIG. 1. As such, the p-wells shown in FIG. 1 are replaced by their corresponding n-wells 304 and 306 respectively.

The source and drain regions of FIG. 3 are replaced by P+ regions 322 and 324 respectively. Likewise, the body contacts 332 are implemented by using an N+ region. The detailed structure and fabrication process of each element shown in FIG. 3 are similar to those of FIG. 1, and hence are not discussed in further detail herein. It should be noted that in FIG. 3 the 5V n-well is larger than its corresponding part shown in FIG. 1. As shown in FIG. 3, the 5V n-well is formed underneath the source region (P+ region 322) as well as the drain region (P+ region 324). As such, the doping density of the MOS transistor 300 shown in FIG. 3 is similar to that of the traditional MOS transistor except the region 306.

Figure 4:
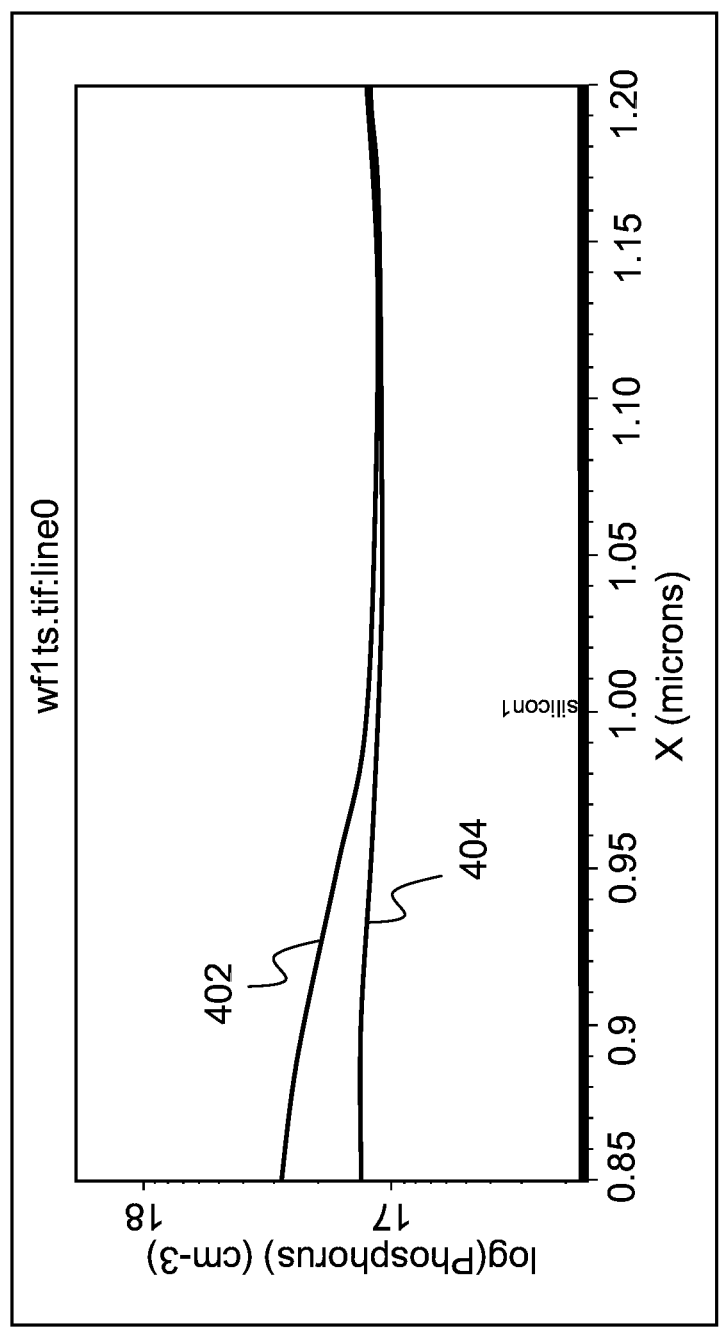
FIG. 4 illustrates two curves illustrating the doping density difference between a traditional MOS transistor with a 5V p-well and the MOS transistor shown in FIG. 3.

FIG. 4 illustrates two curves illustrating the doping density difference between a traditional MOS transistor with a 5V p-well and the MOS transistor shown in FIG. 3. The horizontal axis of FIG. 4 represents the distance from the source region (P+ region 322) to the drain region (P+ region 324) of the MOS transistor 300 shown in FIG. 3. The vertical axis of FIG. 3 represents the doping density.

A curve 402 and a curve 404 illustrate the doping density difference between a traditional MOS transistor with a 5V p-well and the MOS transistor 300 with superimposed n-wells. As shown in FIG. 4, in the region having the superimposed n-wells, the doping density of the MOS transistor 300 shown in FIG. 3 is higher than that of the traditional MOS transistor. On the other hand, the rest region of the MOS transistor 300 shown in FIG. 3 is of a similar doping density as the traditional MOS transistor.

In accordance with an embodiment, the traditional MOS transistor's doping density shown in FIG. 4 is approximately consistent. The doping density is in a range from about $1 \times 10^{17}/cm^3$ and about $6 \times 10^{17}/cm^3$. In contrast, the doping density of the MOS transistor 300 shown in FIG. 3 varies in a bigger range, which has a higher doping density in the region adjacent to the source (P+ region 322). In accordance with an embodiment, the doping density of the MOS transistor 300 shown in FIG. 3 is in a range from about $1 \times 10^{17}/cm^3$ and about $8 \times 10^{17}/cm^3$.

FIG. 4 shows the MOS transistor having the superimposed p-wells may achieve a higher doping density in the region adjacent to the source (P+ region 322). Such a higher doping density helps to improve the punch-through window of the MOS transistor 300. As such, a shorter channel length may be employed to further reduce the pitch and the on resistance of the MOS transistor 300.

Figure 5:
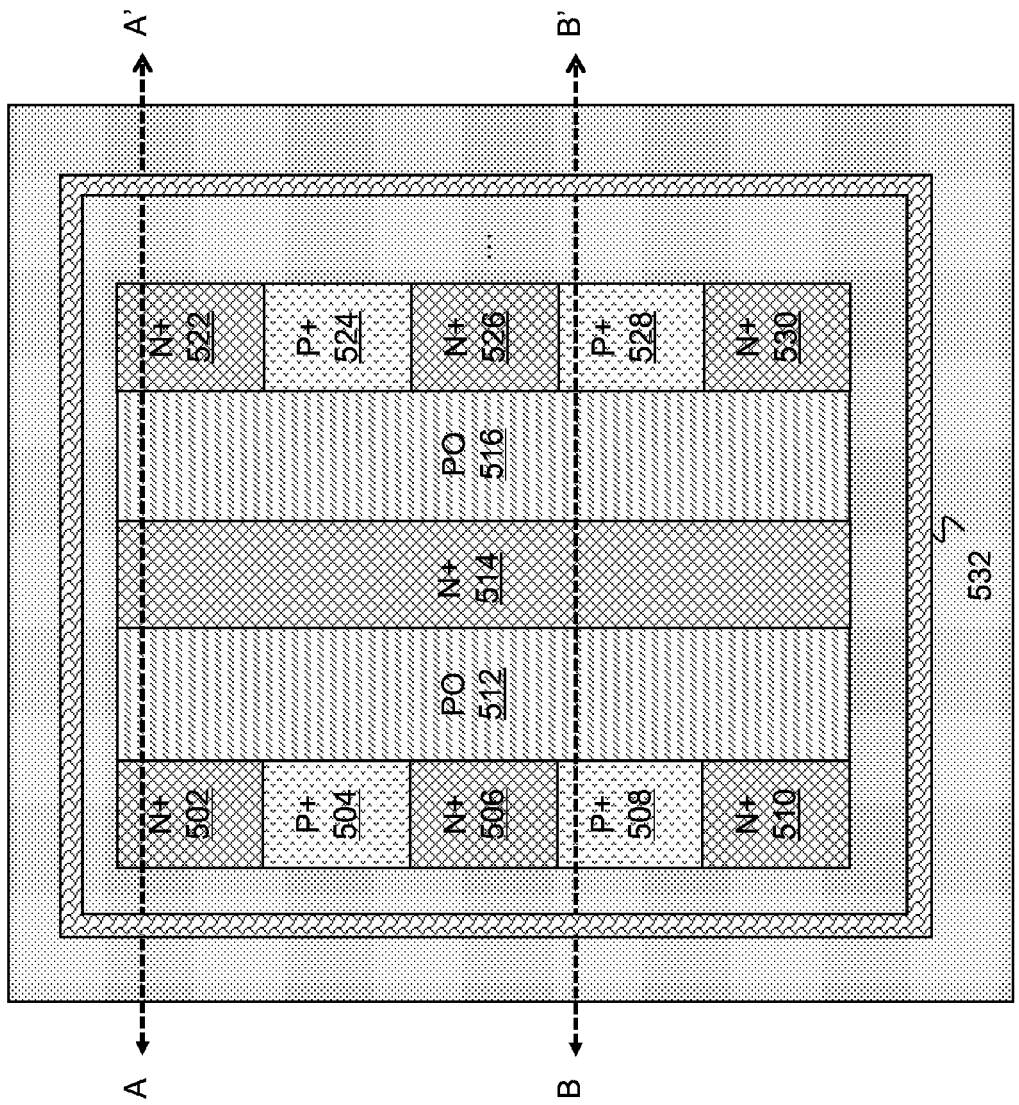
FIG. 5 illustrates a simplified top view of a MOS transistor array in accordance with an embodiment.

FIG. 5 illustrates a simplified top view of a MOS transistor array in accordance with an embodiment. The MOS transistor array may be formed by N-type transistors. The MOS transistor array may comprise two MOS transistors, each of which comprises two superimposed p-wells (not shown but illustrated in FIG. 1). The MOS transistors share a drain region, namely an N+ region 514. The first MOS transistor includes a gate electrode 512, a source region formed by a plurality of N+ regions such as 502, 506 and 510 and a body contact formed by a plurality of P+ regions such as 504 and 508.

Likewise, the second MOS transistor includes a gate electrode 516, a source region formed by a plurality of N+ regions such as 522, 526 and 530. The second MOS transistor further comprises a body contact formed by a plurality of P+ regions such as 524 and 528. It should be noted that the N+ regions (e.g., N+ region 502) and the P+ regions (e.g., P+ region 504) are not drawn to scale. In accordance with an embodiment, the actual ratio between an N+ region (e.g., N+ region 502) and its adjacent P+ region (e.g., N+ region 502) is in a range from about 10:1 to about 2:1.

The MOS transistor array further comprises a P+ pickup ring 532 surrounding the first MOS transistor and the second MOS transistor. The P+ pickup ring 532 may be coupled to the sources of the MOS transistor array. The P+ pickup ring 532 helps to reduce the body effect of the MOS transistor array.

In comparison with traditional MOS transistors, the top view of FIG. 5 shows that source regions (e.g., N+ regions 502, 506 and 510) and body contacts (e.g., P+ region 504 and 508) are formed in an alternating manner. As a result, the body contacts (e.g., P+ region 504) are much closer to the source regions (e.g., N+ region 502). The proximity between the body contacts and source regions helps to improve the body current sink efficiency. As a result, the body resistance may be reduced. In addition, source regions and body contacts formed in an alternating manner helps to reduce the pitch of the MOS transistor.

Figure 6:
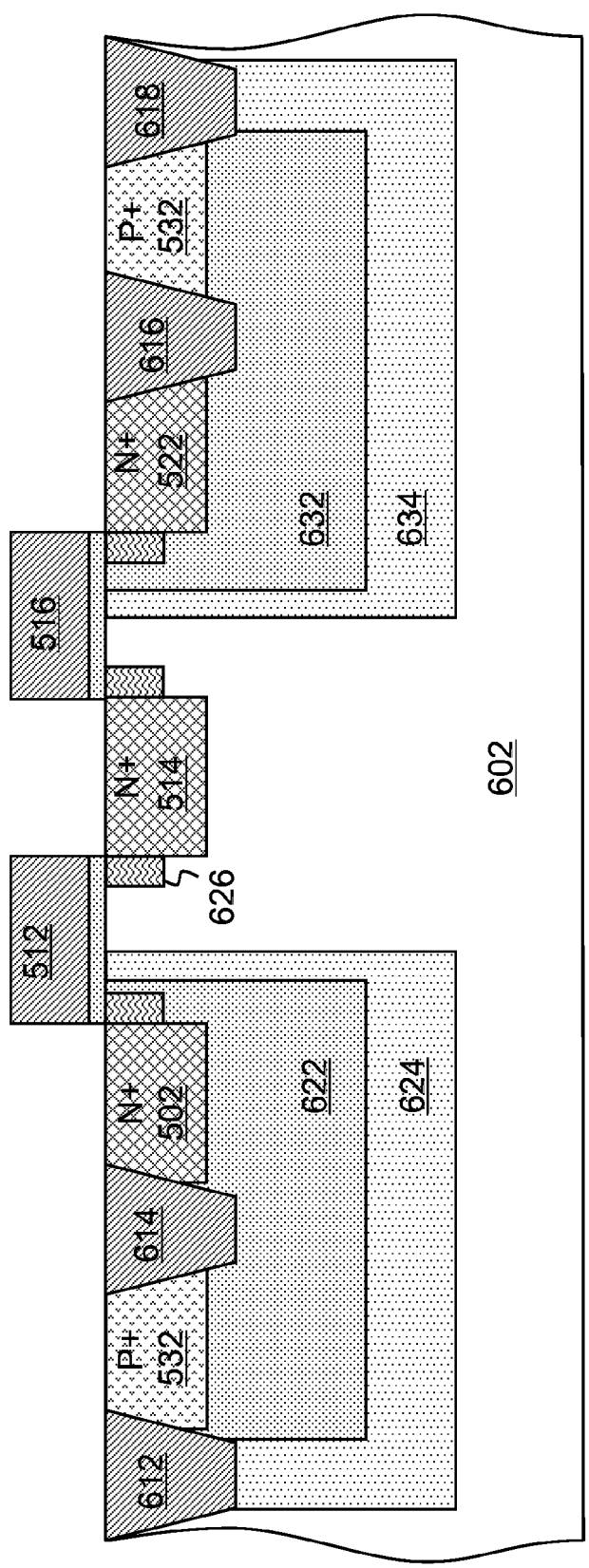
FIG. 6 illustrates a cross-sectional view of the MOS transistor array shown in FIG. 5 in accordance with an embodiment.

FIG. 6 illustrates a cross-sectional view of the MOS transistor array shown in FIG. 5 in accordance with an embodiment. The cross section view is taken along line A-A' shown in FIG. 5. The first MOS transistor and the second MOS transistor share a same drain (N+ region 514). In addition, the first MOS transistor and the second MOS transistor are symmetrical relative to the drain (N+ region 514). Each MOS transistor is of a structure similar to that shown in FIG. 1, and hence is not discussed herein to avoid repetition.

Figure 7:
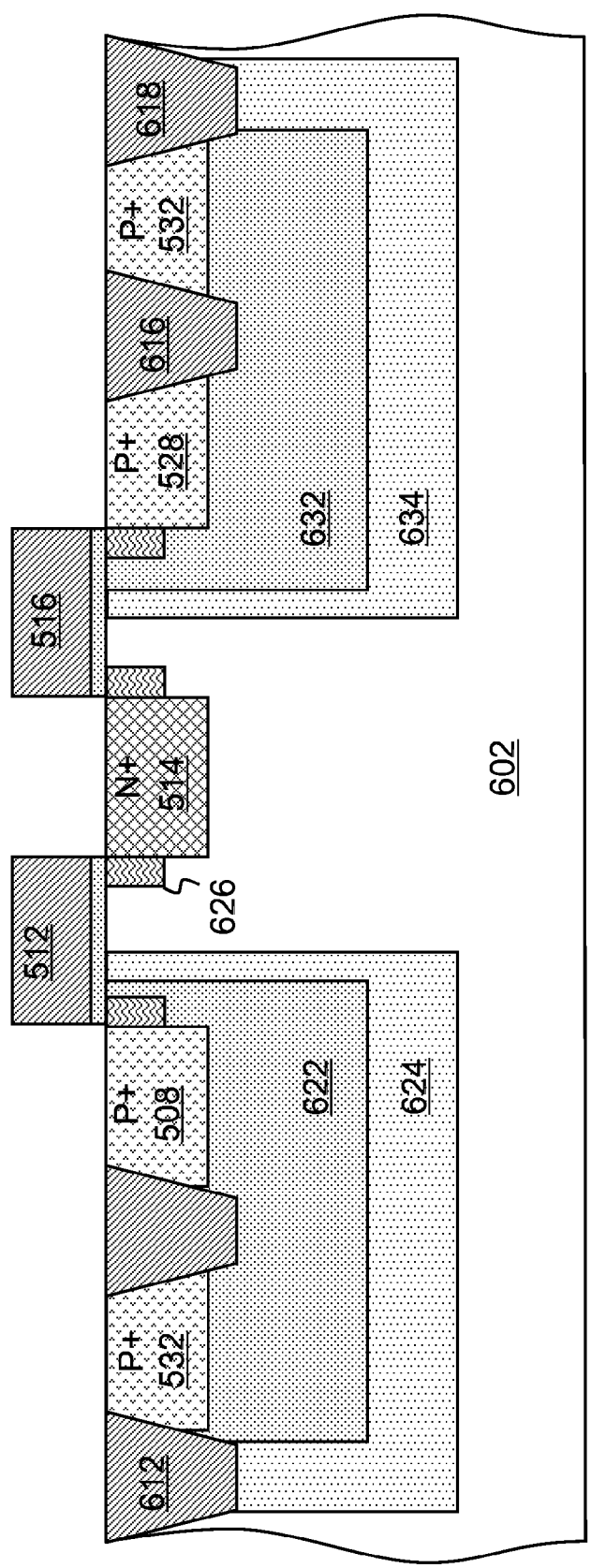
FIG. 7 illustrates another cross-sectional view of the MOS transistor array shown in FIG. 5 in accordance with an embodiment.

FIG. 7 illustrates another cross-sectional view of the MOS transistor array shown in FIG. 5 in accordance with an embodiment. The cross section view is taken along line B-B' shown in FIG. 5. The cross sectional view of FIG. 7 is similar to that of FIG. 6 except that the N+ regions 502 and 522 are replaced by the P+ regions 508 and 528. As described above with respect to FIG. 5, the P+ regions 508 and 528 function as body contacts. By placing body contacts adjacent to the N+ regions 502 and 522 (not shown respectively but illustrated in FIG. 5), the body current sink efficiency may be improved as a result.

Figure 8:
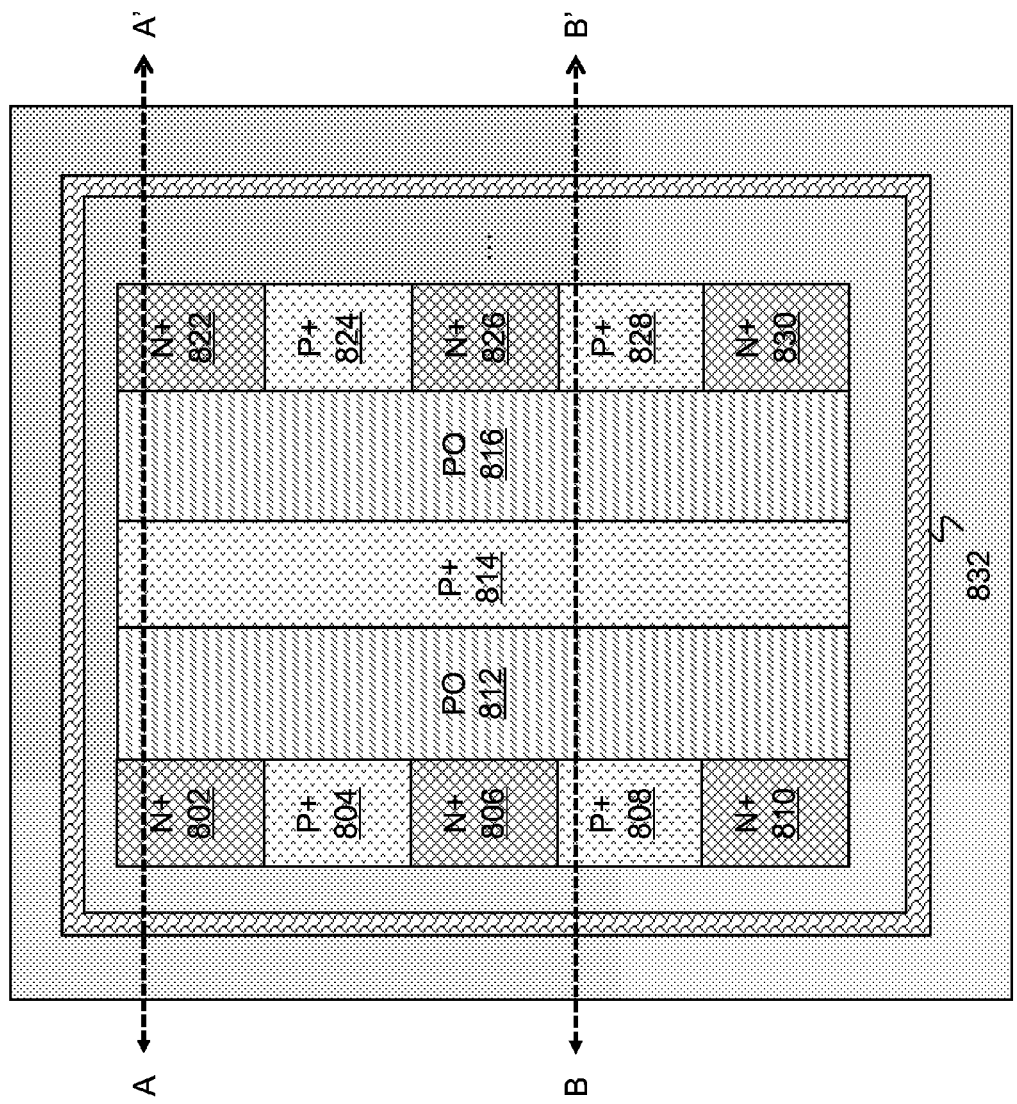
FIG. 8 illustrates a simplified top view of a MOS transistor array in accordance with another embodiment.

FIG. 8 illustrates a simplified top view of a MOS transistor array in accordance with another embodiment. The MOS transistor array shown in FIG. 8 may be formed by P-type transistors. The MOS transistor array may comprise two MOS transistors, each of which comprises two superimposed n-wells (not shown but illustrated in FIG. 3). The MOS transistors share a drain region, namely a P+ region 814.

The first MOS transistor includes a gate electrode 812, a source region formed by a plurality of P+ regions such as 804 and 808, and a body contact formed by a plurality of N+ regions such as 802, 806 and 810. Likewise, the second MOS transistor includes a gate electrode 816, a source region formed by a plurality of P+ regions such as 824 and 828, and a body contact formed by a plurality of N+ regions such as 822, 826 and 830. It should be noted that the N+ regions (e.g., N+ region 802) and the P+ regions (e.g., P+ region 804) are not drawn to scale. The actual dimensional ratio between an N+ region and its adjacent P+ region is in a range from about 1:2 to about 1:10.

The MOS transistor array further comprises an N+ pickup ring 832 surrounding the first MOS transistor and the second MOS transistor. The N+ pickup ring 832 may be coupled to a high voltage potential (not shown) of the MOS transistor array. The N+ pickup ring 832 helps to reduce the body effect of the MOS transistor array.

Similar to the structure of FIG. 8, the source regions (e.g., P+ regions 804 and 808) and body contacts (e.g., N+ region 802, 806 and 808) are formed in an alternating manner. As a result, the body contacts are much closer to the source regions. The proximity between the body contacts and source regions helps to improve the body current sink efficiency. As a result, the body resistance may be reduced. In addition, source regions and body contacts formed in an alternating manner helps to reduce the pitch of the MOS transistor.

Figure 9:
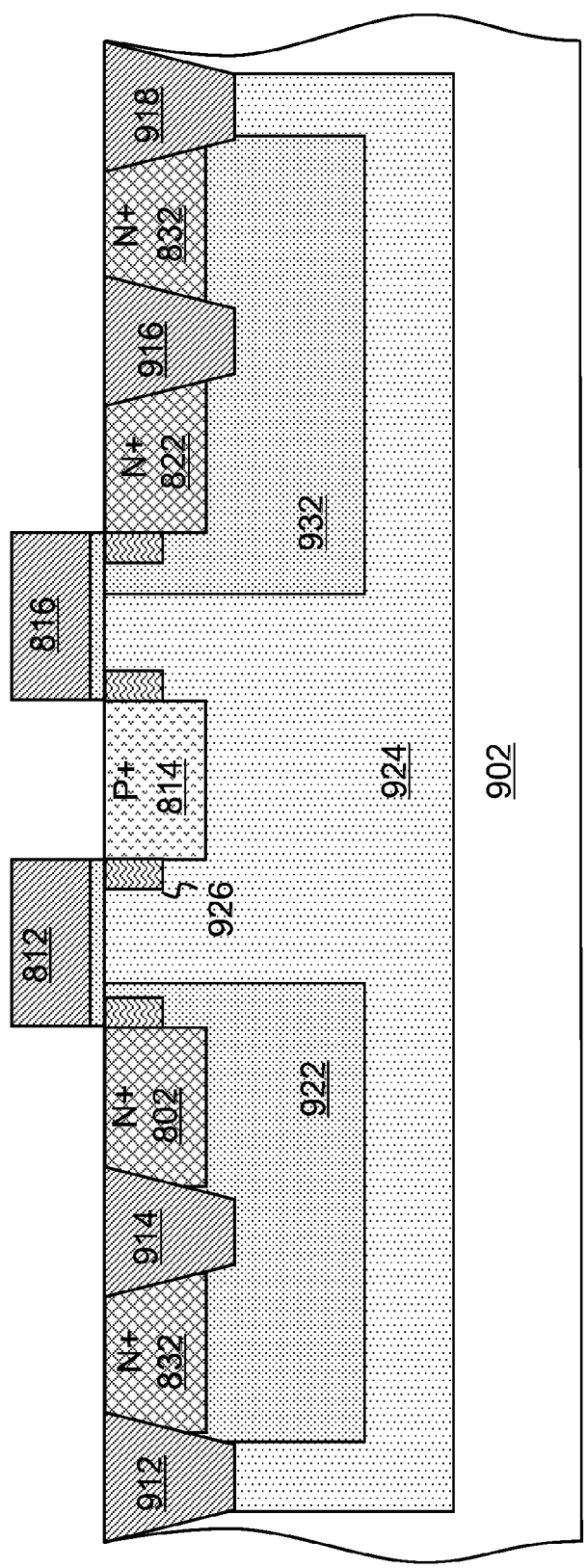
FIG. 9 illustrates a cross-sectional view of the MOS transistor array shown in FIG. 8 in accordance with an embodiment.

FIG. 9 illustrates a cross-sectional view of the MOS transistor array shown in FIG. 8 in accordance with an embodiment. The cross section view is taken along line A-A' shown in FIG. 8. The first MOS transistor and the second MOS transistor share a same drain. In addition, the first MOS transistor and the second MOS transistor are symmetrical relative to the drain (P+ region 814). Each MOS transistor is of a structure similar to that shown in FIG. 3, and hence is not discussed herein to avoid repetition.

Figure 10:
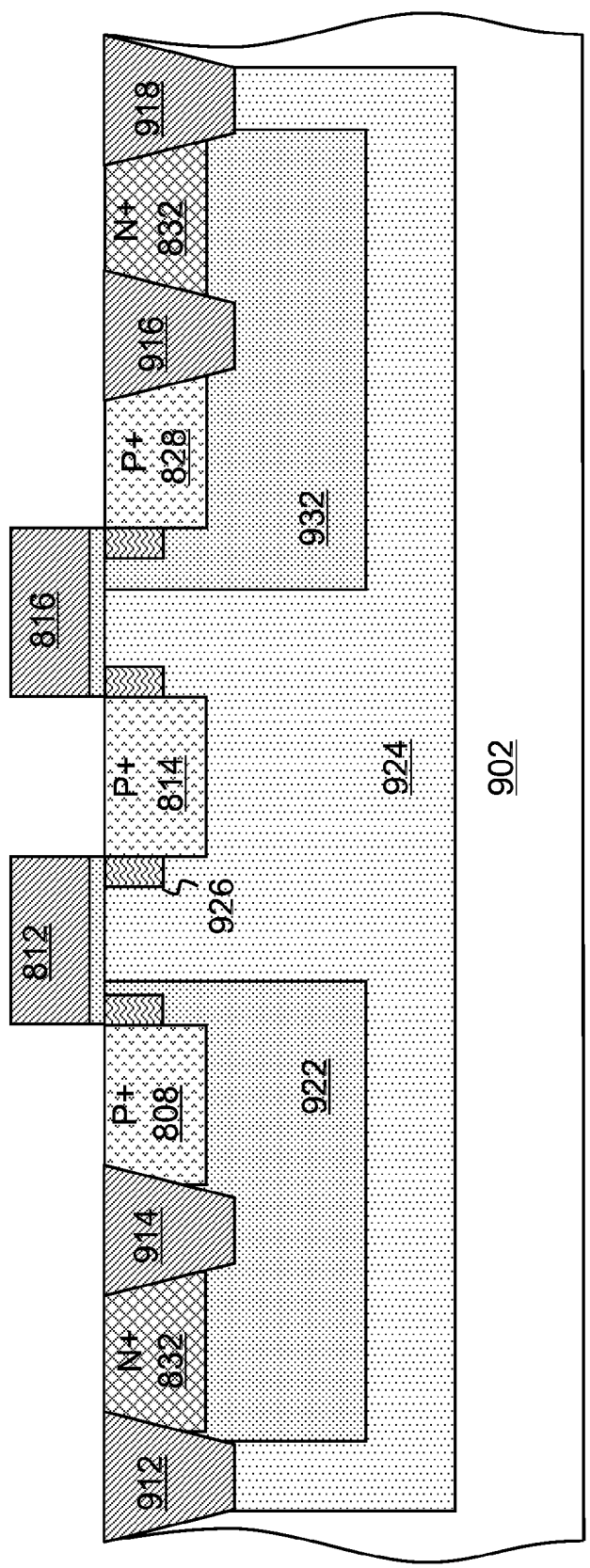
FIG. 10 illustrates another cross-sectional view of the MOS transistor array shown in FIG. 8 in accordance with an embodiment.

FIG. 10 illustrates another cross-sectional view of the MOS transistor array shown in FIG. 8 in accordance with an embodiment. The cross section view is taken along line B-B' shown in FIG. 8. The cross sectional view of FIG. 10 is similar to that of FIG. 9 except that the N+ regions 802 and 822 are replaced by the P+ regions 808 and 828, and hence is not discussed herein.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device comprising:
a substrate comprising a substrate region of a first conductivity;
a first region of the first conductivity formed in the substrate, wherein the first region has a higher doping density than the substrate region;
a second region of the first conductivity formed in the first region, wherein the second region has a higher doping density than the first region, and wherein at least one sidewall of the second region is in direct contact with the first region;
a first drain/source region of a second conductivity formed in the second region;
a second drain/source region of the second conductivity formed in the substrate and directly contacting the substrate region, wherein a first conductivity type doping density gradually declines from the first drain/source region to the second drain/source region and the first drain/source region and the second drain/source region have a same doping density range; and
a pickup region of the first conductivity having a first portion formed in the second region and adjacent to the first drain/source region and a second portion formed in the substrate, wherein the first portion of the pickup region is between a first isolation region and a second isolation region, and wherein the first isolation region is in the second region and the second isolation region is in the first region, and wherein a portion of the second region in direct contact with the first portion of the pickup region has a higher doping density than a portion of the substrate in direct contact with the second portion of the pickup region.

2. The semiconductor device of claim 1, further comprising:
a gate electrode formed between the first drain/source region and the second drain/source region.

3. The semiconductor device of claim 2, further comprising:
a first lightly doped drain/source region formed adjacent to the first drain/source region in the second region.

4. The semiconductor device of claim 2, further comprising:
a second lightly doped drain/source region formed adjacent to the second drain/source region in the substrate, wherein the second lightly doped drain/source region is under the gate electrode.

5. The semiconductor device of claim 2, further comprising:
a first lightly doped drain/source region and a second lightly doped drain/source region symmetrical relative to the gate electrode.

6. The semiconductor device of claim 1, wherein:
the pickup region surrounds the first drain/source region and the second drain/source region.

7. The semiconductor device of claim 1, wherein:
the first drain/source region is a source; and
the second drain/source region is a drain.

8. The semiconductor device of claim 1, wherein:
doping density values of the second region, doping density values of the first region and doping density values of the substrate form a gradually downward slope.

9. A device comprising:
a substrate comprising a substrate region of a first conductivity;
a gate electrode over the substrate;
a first drain/source region and a second drain/source region disposed on opposite sides of the gate electrode in the substrate, wherein the first drain/source region and the second drain/source region have a second conductivity and a bottom of the first drain/source region is level with a bottom of the second drain/source region;
a first doped well having the first conductivity formed adjacent to the first drain/source region;
a second doped well having the first conductivity formed adjacent to the first drain/source region, wherein the first doped well is embedded in the second doped well, and wherein the substrate, the first doped well and the second doped well are configured such that a doping density of the first conductivity gradually declines from the bottom of the first drain/source region to the bottom of the second drain/source region; and
a body pickup ring of the first conductivity comprising a first portion formed in the first doped well and a second portion formed in the substrate, wherein:

the first portion of the body pickup ring extends from a first isolation region to a second isolation region, and wherein the second isolation region is in direct contact with the first drain/source region, and wherein a bottom surface of the first isolation region is in direct contact with the second doped well, and a bottom surface of the second isolation region is in direct contact with the first doped well;

the second portion of the body pickup ring extends from a third isolation region to a fourth isolation region, and wherein the third isolation region is in direct contact with the second drain/source region, and wherein a first doping density ratio of the second portion of the body pickup ring to the substrate immediately adjacent to the second portion of the body pickup ring is greater than a second doping density ratio of the first portion of the body pickup ring to the first doped well immediately adjacent to the first portion of the body pickup ring; and the first portion of the body pickup ring is connected to the substrate through the first doped well and the second doped well.

10. The device of claim 9, further comprising:
a first lightly doped drain/source region formed adjacent to the first drain/source region in at least one doped well.

11. The device of claim 9, further comprising:
a first lightly doped drain/source region and a second lightly doped drain/source region symmetrical relative to the gate electrode, and adjacent to the first drain/source region and the second drain/source region respectively.

12. A device comprising:
a first region formed in a substrate, wherein the first region has a higher doping density than a substrate region underneath the first region;
a second region formed in the first region, wherein the second region has a higher doping density than the first region;
a first drain/source region formed in the second region;
a second drain/source region formed in the substrate and directly contacting the substrate region, wherein a doping density gradually declines from the first drain/source region to the second drain/source region and the first drain/source region and the second drain/source region have a same doping density range; and
a pickup region having a first portion formed in the second region and a second portion formed in the substrate, wherein the first portion of the pickup region is between a first isolation region and a second isolation region, and the second portion of the pickup region is between a third isolation region and a fourth isolation region, and wherein the first isolation region is in contact with the first drain/source region and formed in the second region and the second isolation region is in the first region, and wherein the first isolation region has a bottom in direct contact with the second region, and the second isolation region has a bottom in direct contact with the first region.

13. The device of claim 12, wherein:
the substrate and the first region have a same conductivity.

14. The device of claim 12, wherein:
the substrate and the second region have a same conductivity.

15. The device of claim 12, wherein:
the first drain/source region has an N-type conductivity; and
the substrate has a P-type conductivity.

16. The device of claim 12, wherein:
the substrate and the pickup region have a same conductivity.

17. The device of claim 12, wherein:
the bottom of the second isolation region extends from a sidewall of the first region to a sidewall of the second region.

18. The device of claim 17, wherein:
a width of the bottom of the second isolation region is substantially equal to a width between the sidewall of the first region and the sidewall of the second region.

* * * * *